United States Patent
Kato et al.

(10) Patent No.: US 8,810,340 B2
(45) Date of Patent: Aug. 19, 2014

(54) SIGNAL LINE DISPOSED IN A FLEXIBLE INSULATING MAIN BODY, WHERE THE MAIN BODY INCLUDES A CONNECTOR PORTION WHICH IS WIDER THAN A SIGNAL PORTION

(75) Inventors: Noboru Kato, Nagaokakyo (JP); Jun Sasaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/367,392

(22) Filed: Feb. 7, 2012

(65) Prior Publication Data

US 2012/0133458 A1 May 31, 2012

Related U.S. Application Data

(63) Continuation of application No. PCT/JP2010/062240, filed on Jul. 21, 2010.

(30) Foreign Application Priority Data

Aug. 11, 2009 (JP) ................................. 2009-186283

(51) Int. Cl.
*H01P 3/08* (2006.01)
*H01P 3/00* (2006.01)
*H05K 1/02* (2006.01)

(52) U.S. Cl.
CPC ............... *H01P 3/085* (2013.01); *H01P 3/088* (2013.01); *H01P 3/00* (2013.01); *H01P 3/08* (2013.01); *H05K 1/0227* (2013.01); *H05K 1/0253* (2013.01); *H05K 1/028* (2013.01); *H05K 2201/0191* (2013.01); *H05K 2201/0715* (2013.01)
USPC ........................................... 333/238; 333/33

(58) Field of Classification Search
CPC ................................. H01P 3/085; H01P 3/088
USPC ............................................ 333/238, 246, 33
See application file for complete search history.

(56) References Cited

U.S. PATENT DOCUMENTS 3,961,296 A * 6/1976 Wiggenhorn ................. 333/238
5,317,292 A * 5/1994 Leeb ............................. 333/238
(Continued)

FOREIGN PATENT DOCUMENTS

JP 2000-323847 A 11/2000
JP 2007-123740 A 5/2007
(Continued)

OTHER PUBLICATIONS

Official Communication issued in International Patent Application No. PCT/JP2010/062240, mailed on Sep. 7, 2010.
(Continued)

*Primary Examiner* — Benny Lee
(74) *Attorney, Agent, or Firm* — Keating & Bennett, LLP

(57) ABSTRACT

A signal line that can be easily bent and significantly reduces loss generated in a high-frequency signal includes a main body including a plurality of insulating sheets made of a flexible material and stacked on each other in a stacking direction. Ground conductors are provided in the main body on the positive z-axis direction side of a signal line. The ground conductors have a slit S formed therein that overlaps the signal line when viewed in plan from the z-axis direction. A ground conductor is provided in the main body on the negative z-axis direction side of the signal line, and is overlapped by the signal line when viewed in plan from the z-axis direction. The ground conductors and the signal line define a strip line structure. A distance between the ground electrodes and the signal line is smaller than a distance between the ground electrode and the signal line.

6 Claims, 4 Drawing Sheets

(56) References Cited

U.S. PATENT DOCUMENTS

| | | | |
|---|---|---|---|
| 6,639,487 B1* | 10/2003 | Salmela et al. | 333/34 |
| 7,224,249 B2* | 5/2007 | van Quach et al. | 333/238 |
| 7,940,144 B2* | 5/2011 | Koch et al. | 333/33 |
| 2005/0083147 A1* | 4/2005 | Barr | 333/33 |
| 2008/0196929 A1 | 8/2008 | Takamatsu et al. | |
| 2009/0027144 A1* | 1/2009 | Saito | 333/238 |

FOREIGN PATENT DOCUMENTS

| | | |
|---|---|---|
| JP | 2008-198931 A | 8/2008 |
| JP | 2009-054876 A | 3/2009 |

OTHER PUBLICATIONS

Official Communication issued in corresponding Japanese Patent Application No. 2012-106486, mailed on Aug. 6, 2013.

* cited by examiner

US 8,810,340 B2

SIGNAL LINE DISPOSED IN A FLEXIBLE INSULATING MAIN BODY, WHERE THE MAIN BODY INCLUDES A CONNECTOR PORTION WHICH IS WIDER THAN A SIGNAL PORTION

BACKGROUND OF THE INVENTION

1. Field of the Invention

The present invention relates to signal lines, and more specifically to signal lines including ground conductors and signal lines.

2. Description of the Related Art

Examples of existing inventions regarding signal lines include a printed wiring substrate disclosed in Japanese Unexamined Patent Application Publication No. 2009-54876. FIG. 5 is a cross-sectional structure diagram of a printed wiring substrate 500 disclosed in Japanese Unexamined Patent Application Publication No. 2009-54876. In FIG. 5, the z-axis, y-axis, and x-axis are respectively defined to be the up-down direction, the left-right direction, and a direction perpendicular to the sheet.

Referring to FIG. 5, the printed wiring substrate 500 includes an insulating layer 502, a signal line 504, and electrode planes 506 and 508. The signal line 504 extends in the x-axis direction within the insulating layer 502. The electrode plane 506 is arranged on the positive z-axis direction side of the signal line 504. The electrode plane 508 is arranged on the negative z-axis direction side of the signal line 504. Further, the electrode plane 508 has a line-shaped opening portion 510 arranged therein so as to be overlapped by the signal line 504. A high-frequency signal is transmitted through the signal line 504. The ground potential is applied to the electrode planes 506 and 508. In other words, the signal line 504 and the electrode planes 506 and 508 form a strip line structure.

In the printed wiring substrate 500 configured as described above, the printed wiring substrate 500 can be easily bent. In more detail, the line-shaped opening portion 510 is provided in the electrode plane 508. Hence, the electrode plane 508 can elastically stretch and shrink more easily than the electrode plane 506, which does not have the line-shaped opening portion 510 provided therein. As a result, the printed wiring substrate 500 can be easily bent.

However, the printed wiring substrate 500 has a problem in that high-frequency signal loss is generated. In more detail, when a high-frequency signal is transmitted through the signal line 504, a magnetic field passing through the electrode planes 506 and 508 is generated around the signal line 504. Since a current varies periodically in a high-frequency signal, the generated magnetic field also varies periodically. When the magnetic field varies periodically in this manner, an eddy current is generated in the electrode planes 506 and 508 by electromagnetic induction to counteract the variations of the magnetic field. As a result, eddy current loss is generated in a signal transmitted through the signal line 504.

SUMMARY OF THE INVENTION

Preferred embodiments of the present invention provide a signal line that can be easily bent and that can reduce high-frequency signal loss.

A signal line according to a preferred embodiment of the present invention includes a main body including a stacked plurality of insulating sheets made of a flexible material; a signal line defined by a line-shaped conductor provided in the main body; a first ground conductor having a slit formed therein, the first ground conductor being provided on one side of the signal line in the stacking direction, the slit overlapping the signal line when viewed in plan from the stacking direction; and a second ground conductor provided on the other side of the signal line in the stacking direction, the second ground conductor being overlapped by the signal line when viewed in plan from the stacking direction. The first ground conductor, the second ground conductor, and the signal line define a strip line structure, and a distance in the stacking direction between the first ground conductor and the signal line is smaller than a distance in the stacking direction between the second ground conductor and the signal line.

According to various preferred embodiments of the present invention, a signal line can be easily bent and high-frequency signal loss is significantly reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a signal line according to preferred embodiments of the present invention is described with reference to the drawings, wherein like features in different drawings are designated by the same reference labels, which may not be described in all drawings in which they appear.

Hereinafter, the configuration of a signal line according to preferred embodiments of the present invention is described with reference to the drawings.

Figure 1:
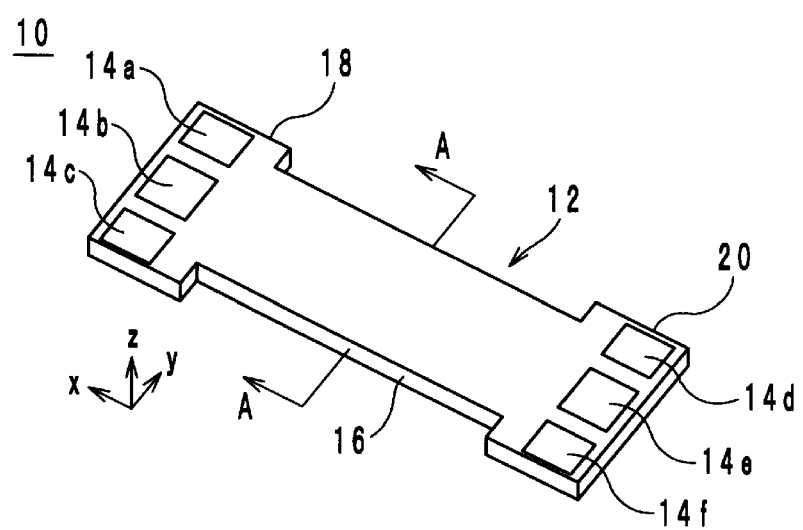
FIG. 1 is an external perspective view of a signal line according to a preferred embodiment of the present invention.
Figure 2A:
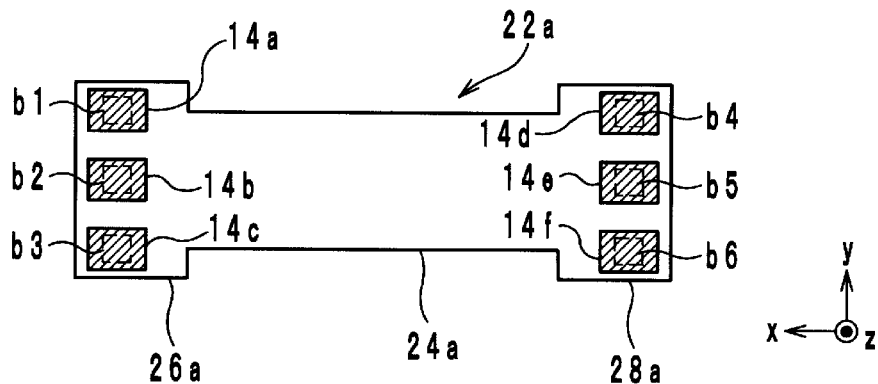
FIGS. 2A to 2D include exploded diagrams of the signal line illustrated in FIG. 1.
Figure 3:
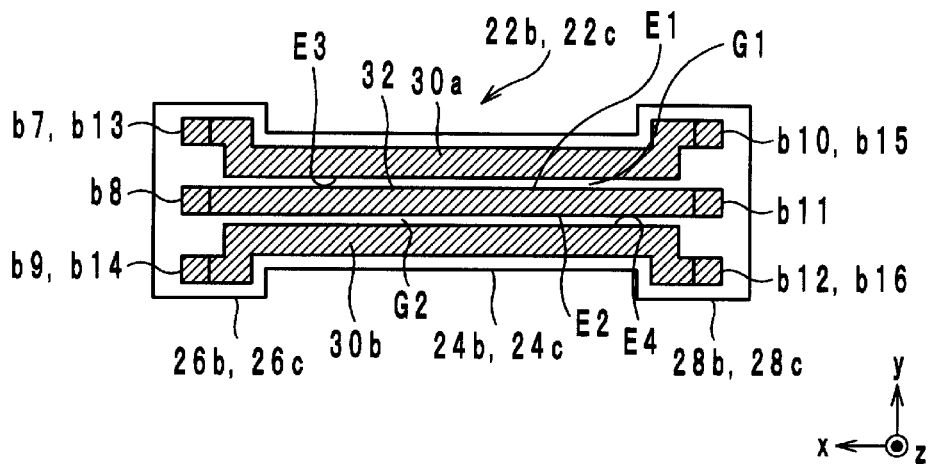
FIG. 3 is a perspective diagram illustrating insulating sheets of the signal line viewed from the stacking direction.
Figure 4:
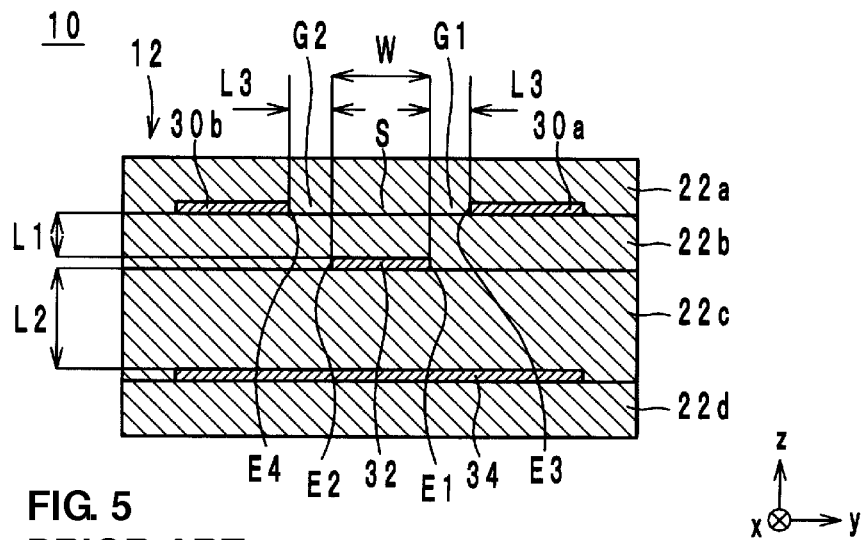
FIG. 4 is a cross-sectional structure diagram taken along line A-A in FIG. 1.

FIG. 1 is an external perspective view of a signal line 10 according to a preferred embodiment of the present invention. FIGS. 2A to 2D include exploded diagrams of the signal line 10 illustrated in FIG. 1. FIG. 3 is a perspective diagram illustrating insulating sheets 22b and 22c of the signal line 10 viewed from the stacking direction. FIG. 4 is a cross-sectional structure diagram taken along line A-A in FIG. 1. In FIGS. 1, 2A-2D, 3, and 4, the stacking direction of the signal line 10 is defined to be the z-axis direction. The longitudinal direction of the signal line 10 is defined to be the x-axis direction, and a direction perpendicular to the x-axis and z-axis is defined to be the y-axis direction.

For example, the signal line 10 connects two circuit substrates within an electronic apparatus, such as a cellular phone. Referring to FIGS. 1 and 2A-2D, the signal line 10 (FIG. 1) includes a main body 12 (FIG. 1), external terminals 14a, 14b, 14c, 14d, 14e, and 14f as shown in FIGS. 1 and 2A, ground conductors 30a, 30b (FIG. 2B) and 34 (FIG. 2D), a signal line 32 (FIG. 2C), and via hole conductors b1-b6 (FIG. 2A), b7-b12 (FIG. 2B), and b13-b16 (FIG. 2C).

Referring to FIG. 1, the main body 12 includes a signal line portion 16 and connector portions 18 and 20. The signal line portion 16 extends in the x-axis direction and includes therein the signal line 32 and the ground conductors 30a, 30b, and 34. The signal line portion 16 is configured to be bendable in a U shape. The connector portions 18 and 20, which are arranged at the two ends of the signal line portion 16 in the x-axis direction, are connected to the connecters of a circuit substrate (not shown). The main body 12 is formed preferably by stacking insulating sheets 22a to 22d in this sequence from the positive z-axis direction side to the negative z-axis direction side, for example.

The insulating sheets 22a to 22d are preferably made of a thermoplastic resin such as a flexible liquid crystal polymer. Referring to FIGS. 2A to 2D, the insulating sheets 22a to 22d respectively include signal line portions 24a to 24d and connector portions 26a to 26d and 28a to 28d. The signal line portions 24a to 24d constitute the signal line portion 16 of the main body 12, and the connector portions 26a to 26d and 28a to 28d respectively constitute the connector portions 18 and 20 of the main body 12. Note that, hereinafter, main surfaces of the insulating sheets 22a to 22d facing in the positive z-axis direction are called front surfaces, and main surfaces of the insulating sheets 22a to 22d facing in the negative z-axis direction are called back surfaces.

The external terminals 14a to 14c are arranged in a row along the y-axis direction on the front surface of the connector portion 26a, as illustrated in FIG. 2A. The external terminals 14a to 14c, when the connector portion 18 is inserted into the connector of a circuit substrate, come into contact with terminals within the connector. Specifically, the external terminals 14a and 14c come into contact with the ground terminals within the connector, and the external terminal 14b comes into contact with a signal terminal within the connector. Hence, the ground potential is applied to the external terminals 14a and 14c, and a high-frequency signal is supplied to the external terminal 14b.

The external terminals 14d to 14f are arranged in a row along the y-axis direction on the front surface of the connector portion 28a, as illustrated in FIG. 2A. The external terminals 14d to 14f, when the connector portion 20 is inserted into the connector of a circuit substrate, come into contact with terminals within the connector. Specifically, the external terminals 14d and 14f come into contact with the ground terminals within the connector, and the external terminal 14e comes into contact with a signal terminal within the connector. Hence, the ground potential is applied to the external terminals 14d and 14f, and a high-frequency signal is supplied to the external terminal 14e.

Referring to FIG. 2C, the signal line 32 is a line-shaped conductor arranged within the main body 12 on the front surface of the insulating sheet 22c. Specifically, the signal line 32 extends in the x-axis direction on the front surface of the signal line portion 24c. The two ends of the signal line 32 are positioned in the connector portions 26c and 28c.

Figure 2B:
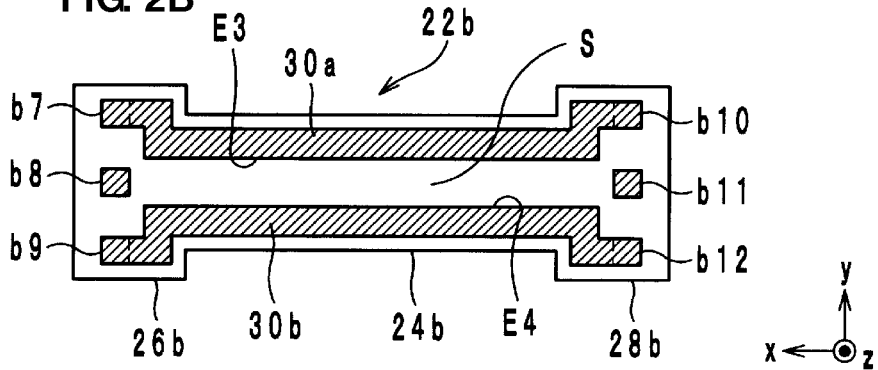
Figure 2C:
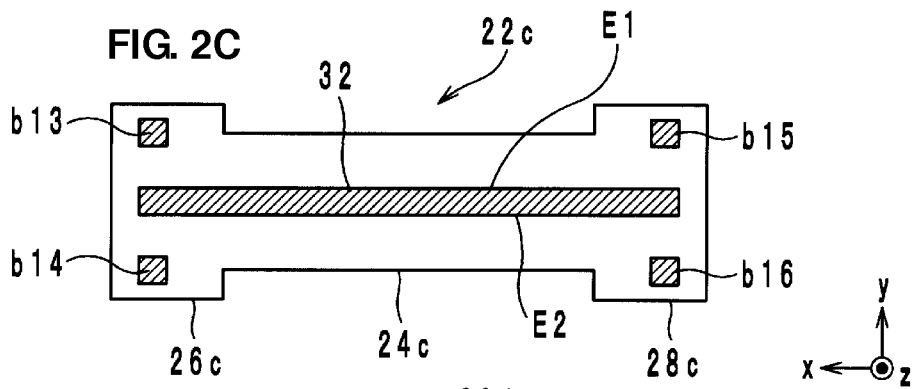

The ground conductors 30a and 30b, as illustrated in FIG. 2B, are arranged in the main body 12 on the positive z-axis direction side of the signal line 32, and more specifically arranged on the front surface of the insulating sheet 22b. The ground conductors 30a and 30b extend along the front surface of the signal line portion 24b in the x-axis direction in parallel or substantially in parallel with each other. First ends of the ground conductors 30a and 30b are positioned in the connector portion 26b and the second ends of the ground conductors 30a and 30b are positioned in the connector portion 28b. The ground conductors 30a and 30b have a slit S formed therein so as to extend in the x-axis direction as shown in FIG. 2B. The slit S will be described below in more detail.

The slit S overlaps the signal line 32 when viewed in plan from the z-axis direction. More specifically, as illustrated in FIGS. 2B and 2C, the signal line 32 includes two edges E1 and E2 extending in the x-axis direction. The ground conductors 30a and 30b respectively include edges E3 and E4 extending in the x-axis direction. The slit S exists between the edges E3 and E4. In other words, the slit S is an area surrounded by the edges E3 and E4. Referring to FIG. 3, when the insulating sheet 22b is stacked on the insulating sheet 22c, the edge E3 is positioned on the positive y-axis direction side of the edge E1, and the edge E4 is positioned on the negative y-axis direction side of the edge E2. Thereby, when viewed in plan from the z-axis direction, the signal line 32 extends in the x-axis direction so as to be located within and not protrude outside of the slit S in the y-axis direction. In other words, as illustrated in FIG. 3, there exist spaces G1 and G2, where the ground conductors 30a and 30b and the signal line 32 do not exist, respectively between the edge E1 and the edge E3 and between the edge E2 and the edge E4, when viewed in plan from the z-axis direction. However, the two ends of the signal line 32 in the x-axis direction protrude outside of the slit S.

Figure 2D:
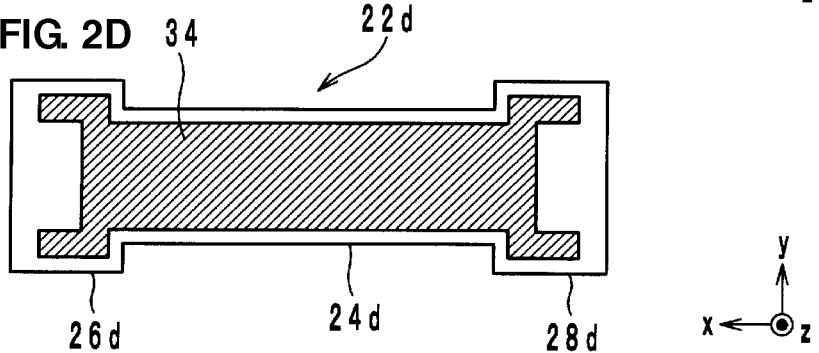

Referring to FIGS. 2C and 2D, the ground conductor 34 is arranged on the negative z-axis direction side of the signal line 32, and more specifically arranged on the front surface of the insulating sheet 22d. The ground conductor 34 extends in the x-axis direction along the front surface of the signal line portion 24d. One end of the ground conductor 34 is arranged in the connector portion 26d so as to be divided into two branches. The other end of the ground conductor 34 is arranged in the connector portion 28d so as to be divided into two branches. Further, as illustrated in FIGS. 2C and 2D, the ground conductor 34 is overlapped by the signal line 32 when viewed in plan from the z-axis direction.

The ground conductors 30a, 30b, and 34 and the signal line 32 having configurations described above define strip line structures. In other words, capacitors are provided between the signal line 32 and the ground conductors 30a and 30b and between the signal line 32 and the ground conductor 34. These two capacitors have approximately the same capacitance.

Referring to FIG. 2A, the via hole conductors b1 and b3 are arranged so as to extend through the connector portion 26a in the z-axis direction and respectively connect the external terminals 14a and 14c to the ground conductors 30a and 30b. As illustrated in FIG. 2A, the via hole conductor b2 is arranged so as to extend through the connector portion 26a in the z-axis direction and is connected to the external terminal 14b.

Referring to FIG. 2B, the via hole conductors b7 and b9 are arranged so as to extend through the connector portion 26b in the z-axis direction and are respectively connected to the ground conductors 30a and 30b. As illustrated in FIGS. 2B and 2C, the via hole conductor b8 is arranged so as to extend through the connector portion 26b in the z-axis direction and connects the via hole conductor b2 to the signal line 32.

Referring to FIG. 2A to 2D, the via hole conductors b13 and b14 (FIG. 2C) are arranged so as to extend through the connector portion 26c in the z-axis direction and connect the via hole conductors b7 and b9 to the ground conductor 34. Thereby, the external terminal 14a, the ground conductor 30a, and the ground conductor 34 are connected to one another through the via hole conductors b1, b7, and b13, and the external terminal 14c, the ground conductor 30b, and the ground conductor 34 are connected to one another through the via hole conductors b3, b9, and b14. Further, the external terminal 14b is connected to the signal line 32 through the via hole conductors b2 and b8.

Referring to FIG. 2A, the via hole conductors b4 and b6 are arranged so as to extend through the connector portion 28a in the z-axis direction and respectively connect the external terminals 14d and 14f to the ground conductors 30a and 30b. As illustrated in FIG. 2A, the via hole conductor b5 is arranged so as to extend through the connector portion 28a in the z-axis direction and is connected to the external terminal 14e.

Referring to FIG. 2B, the via hole conductors b10 and b12, are arranged so as to extend through the connector portion 28b in the z-axis direction and are respectively connected to the ground conductors 30a and 30b. As illustrated in FIGS. 2B and 2C, the via hole conductor b11 is arranged so as to extend through the connector portion 28b in the z-axis direction and connects the via hole conductor b5 to the signal line 32.

Referring to FIGS. 2A to 2D, the via hole conductors b15 and b16 are arranged so as to extend through the connector portion 28c in the z-axis direction and connect the via hole conductors b10 and b12 to the ground conductor 34. Thereby, the external terminal 14d, the ground conductor 30a, and the ground conductor 34 are connected to one another through the via hole conductors b4, b10, and b15, and the external terminal 14f, the ground conductor 30b, and the ground conductor 34 are connected to one another through the via hole conductors b6, b12, and b16. Further, the external terminal 14e is connected to the signal line 32 through the via hole conductors b5 and b11.

Referring to FIG. 4, the cross-sectional structure of the signal line portion 16 will now be described. The distance L1, in the z-axis direction, between the ground conductor 30a and the ground conductor 30b and the signal line 32 (hereinafter called the distance L1 between the signal line 32 and the ground conductors 30a and 30b) is smaller than the distance L2, in the z-axis direction, between the ground conductor 34 and the signal line 32 (hereinafter called the distance L2 between the ground conductor 34 and the signal line 32). In more detail, the insulating sheets 22a, 22b, and 22d preferably have the same thickness in the z-axis direction. On the other hand, the insulating sheet 22c has a larger thickness in the z-axis direction than the insulating sheets 22a, 22b, and 22d. The insulating sheet 22b is arranged between the ground conductors 30a and 30b and the signal line 32. Further, the insulating sheet 22c is arranged between the ground conductor 34 and the signal line 32. As a result, the distance between the signal line 32 and the ground conductors 30a and 30b becomes smaller than the distance L2 between the ground conductor 34 and the signal line 32.

Hereinafter, non-limiting examples of various dimensions of the portions of the signal line 10 will be given below. When viewed in plan from the z-axis, the distance L3 between the edge E1 and the edge E3 or between the edge E2 and the edge E4 is preferably from about 32.5 μm to about 97.5 μm, for example. Specifically, the distance L3 is preferably about 65 μm, for example. The distance L1 between the signal line 32 and the ground conductors 30a and 30b is preferably from about 25 μm to about 75 μm, for example. The distance L1 is preferably about 50 μm, for example. The distance L2 between the ground conductor 34 and the signal line 32 is preferably from about 50 μm to about 150 μm, for example. The distance L2 is preferably about 100 μm, for example. The width W of the signal line 32 in the y-axis direction is preferably about 140 μm, for example. The thicknesses of the signal line 32, the ground conductors 30a, 30b, and 34 in the z-axis direction are preferably about 18 μm, for example.

Hereinafter, a manufacturing method for the signal line 10 is described with reference to the drawings. Although description is made of an example case in which the single signal line 10 is manufactured, a plurality of the signal lines are actually manufactured at the same time by stacking and cutting large insulating sheets.

First, the insulating sheets 22a to 22d are prepared and are preferably formed of a thermoplastic resin, such as a liquid crystal polymer, and which include copper foils formed on the whole front surfaces thereof. Then, the external terminals 14a to 14f illustrated in FIG. 2A are formed on the front surface of the insulating sheet 22a. Specifically, resists having the same shapes as the external terminals 14a to 14f illustrated in FIG. 2A are formed on the copper foil of the insulating sheet 22a using a photolithography process. Then, portions of the copper foil not covered by the resists are removed through an etching process performed on the copper foil. Then, the resists are removed. Thereby, the external terminals 14a to 14f illustrated in FIG. 2A are formed on the front surface of the insulating sheet 22a.

Then, the ground conductors 30a and 30b illustrated in FIG. 2B are formed on the front surface of the insulating sheet 22b. Further, the signal line 32 illustrated in FIG. 2C is formed on the front surface of the insulating sheet 22c using a photolithography process. Likewise, the ground conductor 34 illustrated in FIG. 2D is formed on the front surface of the insulating sheet 22d using a photolithography process. Note that since these photolithography processes are the same as the photolithography process used for forming the external terminals 14, descriptions thereof are omitted.

Then, via holes are formed by irradiating positions of the insulating sheets 22a to 22c at which the via hole conductors b1 to b16 are to be formed with a laser beam from the back surface side. Then, the via holes which have been formed in the insulating sheets 22a to 22c are filled with conductive paste mainly made of copper, whereby the via hole conductors b1 to b16 illustrated in FIGS. 2A to 2D are formed.

Then, the insulating sheets 22a to 22d are stacked in this sequence. The insulating sheets 22a to 22d are press-bonded by applying force to the insulating sheets 22a to 22d isotropically or through an elastic member from the positive direction and negative direction of the z-axis. Thereby, the signal line 10 illustrated in FIG. 1 is obtained.

With the signal line 10 described above, the main body can be easily bent in a U shape so as to protrude in the positive direction of the z-axis. In more detail, in the printed wiring substrate 500 configured as disclosed in Japanese Unexamined Patent Application Publication No. 2009-54876 and shown in FIG. 5, the printed wiring substrate 500 can be easily bent. In more detail, the line-shaped opening portion 510 is provided in the electrode plane 508. Hence, the electrode plane 508 can elastically stretch and shrink more easily than the electrode plane 506, which does not have the line-shaped opening portion 510 provided therein. As a result, the printed wiring substrate 500 can be easily bent.

Figure 6:
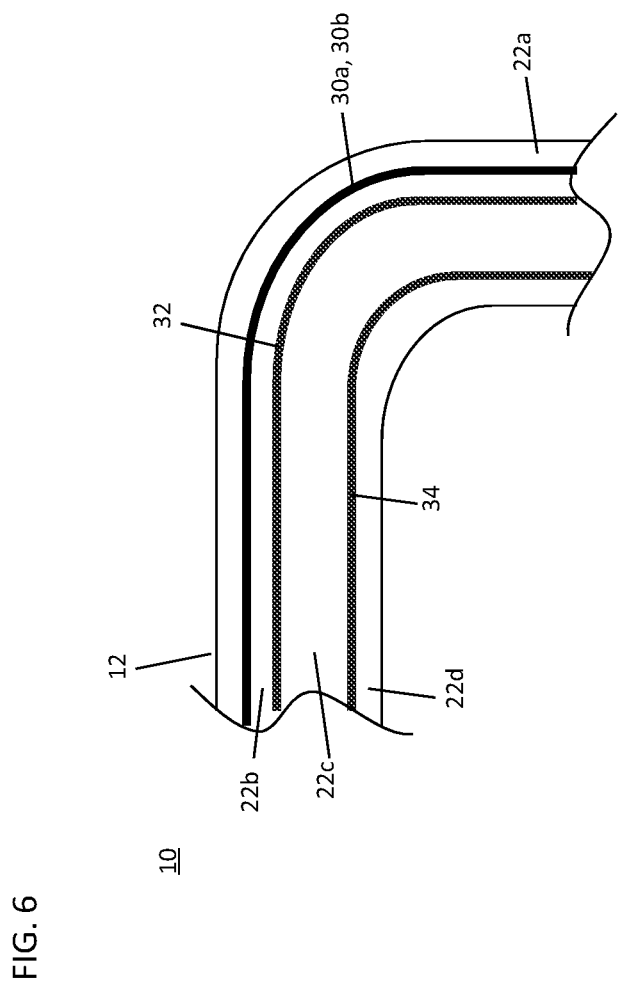
FIG. 6 is a schematic view of the signal line according to a preferred embodiment in a bent configuration.

Further, since the slit S is arranged in the ground conductors 30a and 30b in the signal line 10, the total area of the ground conductors 30a and 30b is smaller than that of the ground conductor 34. Hence, the ground electrodes 30a and 30b stretch more easily than the ground conductor 34. As a result, as shown in FIG. 6, the main body 12 can be easily bent such that the main body 12 protrudes toward the first ground conductor side, which is the positive z-axis direction side, with the ground conductors 30a and 30b positioned on the outer side of the ground conductor 34.

With the signal line 10, the main body 12 can be easily bent in a U shape so as to protrude in the positive direction of the z-axis also due to the following reason. In more detail, in the signal line 10, the signal line 32 needs to have a predetermined characteristic impedance (for example, about 50Ω). Here, when the slit S is provided in the signal line 10, the area where the ground conductors 30a and 30b face the signal line 32 becomes smaller than in the case in which the slit S is not provided in the signal line 10, whereby capacitance generated between the signal line 32 and the ground conductors 30a and 30b also becomes smaller. Hence, in the signal line 10, as illustrated in FIG. 4, the thickness of the insulating sheet 22b in the z-axis direction is made to be small, whereby the distance L1 between the signal line 32 and the ground conductors 30a and 30b is made to be small. Thereby, the capacitance generated between the signal line 32 and the ground conductors 30a and 30b is increased and the predetermined characteristic impedance of the signal line 32 is obtained. Further, by reducing the thickness of the insulating sheet 22b in the z-axis direction, the thickness of the main body 12 in the z-axis direction is reduced, whereby the rigidity of the main body 12 is reduced. As a result, it becomes easy to bend the main body 12 in the signal line 10.

Figure 5:
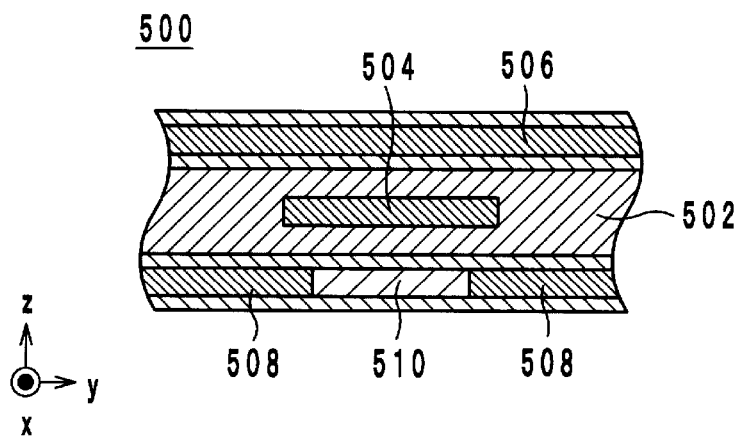
FIG. 5 is a cross-sectional structure diagram of a prior art printed wiring substrate disclosed in Japanese Unexamined Patent Application Publication No. 2009-54876.

In addition, with the signal line 10, generation of loss in high-frequency signals is reduced. In more detail, in the printed wiring substrate 500 disclosed in Japanese Unexamined Patent Application Publication No. 2009-54876 and shown in FIG. 5, when a high-frequency signal is transmitted through the signal line 504, a magnetic field passing through the electrode planes 506 and 508 is generated around the signal line 504. Since a current varies periodically in a high-frequency signal, the generated magnetic field also varies periodically. When the magnetic field varies periodically in this manner, an eddy current is generated in the electrode planes 506 and 508 by electromagnetic induction to counteract the variations of the magnetic field. Specifically in the printed wiring substrate 500, as illustrated in FIG. 5, the distance between the electrode plane 506 and the signal line 504 is the same as the distance between the electrode plane 508 and the signal line 504, and the line-shaped opening portion 510 is provided in the electrode plane 508. Hence, the eddy current is mainly generated in the electrode plane 506, and almost no eddy currents are generated in the electrode plane 508. As a result, in the printed wiring substrate 500, it is important to suppress the eddy current generated in the electrode plane 506 on which the slit S is not provided.

Hence, in the signal line 10, as illustrated in FIG. 4, the distance L1 between the signal line 32 and the ground conductors 30a and 30b is made to be smaller than the distance L2 between the ground conductor 34 and the signal line 32. In other words, the signal line 32 is made to be close to the ground conductors 30a and 30b and far from the ground conductor 34. Thereby, an eddy current generated in the ground conductor by a high-frequency signal transmitted through the signal line 32 is reduced. On the other hand, since the ground conductors 30a and 30b have the slit S formed therein, an eddy current generated in the ground conductors 30a and 30b by a high-frequency signal transmitted through the signal line 32 is negligibly increased. As a result, an eddy current in the signal line 10 is reduced overall, and high-frequency signal loss is reduced in the signal line 10.

In addition, in the signal line 10, variations in characteristic impedance due to manufacturing variations are reduced, as will be described below. In more detail, stacking displacements may occur when the insulating sheets 22a to 22d are stacked. In this case, when the signal line 10 is designed such that the edge E1 is overlapped by the edge E3 and the edge E2 is overlapped by the edge E4 in FIG. 4, the signal line 32 is undesirably overlapped by the ground conductor 30a or the ground conductor 30b due to a minute stacking displacement when viewed in plan from the z-axis direction. As a result, a large capacitance is undesirably generated between the signal line 32 and the ground conductor 30a or 30b, whereby the characteristic impedance of the signal line 10 is considerably changed.

Hence, in the signal line 10, as illustrated in FIG. 3, there exist spaces G1 and G2, where the ground conductors 30a and 30b and the signal line 32 do not exist, respectively between the edge E1 and the edge E3 and between the edge E2 and the edge E4, when viewed in plan from the z-axis direction. As a result, even when stacking displacements are generated in the insulating sheets 22a and 22b, overlapping of the signal line 32 with the ground conductor 30a or the ground conductor 30b when viewed in plan from the z-axis direction is prevented. As a result, generation of a large capacitance between the signal line 32 and the ground conductor 30a or 30b is suppressed, whereby the characteristic impedance of the signal line 10 is prevented from changing considerably.

In the signal line 10, the distance L2 preferably is from about 50 μm to about 75 μm, and the distance L3 preferably is from about 32.5 μm to about 97.5 μm, for example. Preferably, the distance L2 is about 100 μm and the distance L3 is about 65 μm, for example. This allows the width of the slit S in the y-axis direction to have an appropriate relationship with the distance L1 between the signal line 32 and the ground conductors 30a and 30b. As a result, emission of undesirable radiation from the slit S due to a high-frequency signal transmitted through the signal line 32 is suppressed.

Further, in the signal line 10, DC current resistance can be reduced while making the main body 12 easily bendable, as described below. In more detail, in the signal line 10, for example, the thickness of the main body 12 in the z-axis direction may be made small to allow the main body 12 to be easily bent. However, when the thickness of the main body 12 in the z-axis direction is reduced without providing the slit S, capacitance generated between the signal line 32 and the ground conductors 30a, 30b, and 34 is increased. Hence, in this case, the capacitance needs to be reduced by reducing the width W of the signal line 32 in the y-axis direction. However, when the width W of the signal line 32 in the y-axis direction is reduced, the DC resistance of the signal line 32 is undesirably increased.

Hence, in the signal line 10, the slit S is provided in the ground conductors 30a and 30b. Thereby, since capacitance is unlikely to be generated between the signal line 32 and the ground conductors 30a and 30b, the signal line 32 can be arranged close to the ground conductors 30a and 30b without changing the width W of the signal line 32 in the y-axis direction. In other words, the thickness of the main body 12 in the z-axis direction can be made small without increasing the DC resistance of the signal line 32. As a result, the DC resistance can be reduced while making the main body 12 easily bendable, in the signal line 10.

To further clarify the advantageous effects of the signal line 10, the inventor of the present invention performed the following experiment. As a model of the signal line 10, a first model was produced in which the width W was 140 μm and the distances in the z-axis direction between the ground conductor 34 and the ground conductors 30a and 30b were 150 μm. As a model according to a comparative example, a second model was produced in which the slit S was not provided in the signal line 10, the width W was 70 μm, and the distances in the z-axis direction between the ground conductor 34 and the ground conductors 30a and 30b were 150 μm. Note that the first model and the second model were designed to have the same characteristic impedance.

In the first and second models described above, a high-frequency signal having a frequency of 2 GHz was transmitted, and loss generated in the high-frequency signal was computed. The results showed that the generated high-frequency loss was 0.15 dB in the first model, whereas the generated high-frequency signal loss was 0.22 dB in the second model. This is because the second model had the signal line 32 with a smaller width W and, hence, the signal line 32 with a larger DC resistance compared with the first model. Hence, it can be seen that in the signal line 10, the DC resistance can be reduced while keeping a desirable characteristic impedance.

The present invention is useful for signal lines, and is advantageous in terms of the fact that signal lines can be easily bent and loss generated in a high-frequency signal is reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A signal line comprising:
   a main body including a plurality of insulating sheets made of a flexible material and stacked on each other in a stacking direction, a signal line portion, and a connector portion provided at an end of the signal line portion, the connector portion including an external terminal;
   a signal line including a line-shaped conductor provided in the signal line portion of the main body;
   a first ground conductor including a slit located therein, the first ground conductor being provided on a first side of the signal line in the stacking direction, the slit overlapping the signal line when viewed in plan from the stacking direction; and
   a second ground conductor provided on a second side of the signal line in the stacking direction, the second ground conductor being overlapped by the signal line when viewed in plan from the stacking direction; wherein
   the first ground conductor, the second ground conductor, and the signal line define a strip line structure;
   a distance in the stacking direction between the first ground conductor and the signal line is smaller than a distance in the stacking direction between the second ground conductor and the signal line;
   the first ground conductor includes two first edge portions extending in a predetermined direction, the slit is located between the two first edge portions, the signal line includes two second edge portions extending in the predetermined direction, and neither the first ground conductor nor the signal line is disposed in spaces between the first edge portions and the second edge portions when viewed in plan from the stacking direction;
   the signal line portion is defined by a first portion of the main body extending from a first outer longitudinal edge of the main body to a second outer longitudinal edge of the main body opposed to the first outer longitudinal edge;
   the connector portion is defined by a second portion of the main body extending from the first outer longitudinal edge of the main body to the second outer longitudinal edge of the main body opposed to the first outer longitudinal edge; and
   a width of the connector portion extending from the first outer longitudinal edge to the second outer longitudinal edge is greater than a width of the signal line portion extending from the first outer longitudinal edge to the second outer longitudinal edge.

2. The signal line according to claim 1, wherein the signal line portion does not include any via hole conductors, and the connector portion includes a via hole conductor connecting the signal line and the external terminal.

3. The signal line according to claim 2, wherein the main body is bent so as to protrude toward the first ground conductor side in the stacking direction such that the first ground conductor protrudes farther outward from a bent portion of the main body than the second ground conductor.

4. The signal line according to claim 1, further comprising a via hole conductor connecting the first ground conductor and the second ground conductor.

5. The signal line according to claim 4, wherein the via hole conductor is provided at the connector portion.

6. The signal line according to claim 1, wherein a distance between the first edge portion and the second edge portion is from about 32.5 μm to about 97.5 μm when viewed in plan from the stacking direction, a distance in the stacking direction between the first ground conductor and the signal line is from about 25 μm to about 75 μm, and a distance in the stacking direction between the second ground conductor and the signal line is about 50 μm to about 150 μm.

* * * * *